United States Patent [19]

Hara et al.

[11] 4,317,754

[45] Mar. 2, 1982

[54] CURABLE RESIN COMPOSITION

[75] Inventors: Hajime Hara, Fujisawa; Shingo Orii, Kawasaki; Yoshihiko Araki, Tokyo, all of Japan

[73] Assignee: Nippon Oil Co., Ltd., Tokyo, Japan

[21] Appl. No.: 210,303

[22] Filed: Nov. 25, 1980

[30] Foreign Application Priority Data

Dec. 6, 1979 [JP] Japan .................................. 54-157376
Mar. 12, 1980 [JP] Japan .................................. 55-30254

[51] Int. Cl.$^3$ .............................................. C08L 61/10
[52] U.S. Cl. .................................. 525/501.5; 428/511; 428/512; 428/441; 525/502
[58] Field of Search .............. 260/19 R, 19 A, 19 UA

[56] References Cited

U.S. PATENT DOCUMENTS

| 3,867,323 | 2/1975 | Rifi | 260/19 R |
| 4,139,500 | 2/1979 | Rudolphy | 260/19 UA |
| 4,158,650 | 6/1979 | Kato | 260/19 UA |

Primary Examiner—Paul R. Michl
Attorney, Agent, or Firm—Robert E. Burns; Emmanuel J. Lobato; Bruce L. Adams

[57] ABSTRACT

A curable resin composition is disclosed for use in the manufacture of laminates applied to electronics equipment. The composition essentially comprises a resol type phenolic resin which is obtained from the reaction of an amidated drying oil and a phenol-formaldehyde in the presence of an alkali catalyst. Another form of the composition includes an amidated butadiene polymer to provide improved flexibility and chemicals resistance.

14 Claims, No Drawings

CURABLE RESIN COMPOSITION

BACKGROUND OF THE INVENTION

1. Field of the Invention

This invention relates to phenolic resin compositions, more particularly to such resinous compositions which may be readily adapted for the manufacture of laminates useful in the field of telecommunications and electronics equipment and applicances.

2. Prior Art

The rapid technological advanced during the recent years in telecommunications and electronics has created a demand for high quality laminates which satisfy the various electrical and physical property requirements including dielectric constant, flexibility, chemicals resistance, dimensional stability and cold punching workability.

It has heretofore been proposed to this end therefore to provide flexible phenolic resins by for instance adding a thermoplastic polymer or a plasticizer to a phenolic resin, or by using long-chain hydrocarbon substituted phenol derivatives as the starting material, or by blending the resin with rubber. These alternatives have however proven to be unsatisfactory in their performance.

It has also been proposed to provide phenolic resins eligible for laminates by reacting phenols with drying oils or liquid diolefin polymers in the presence of acid catalysts and subsequently with formaldehyde. This proposal has a drawback in that phenols can be added only slowly to such drying oils or liquid diolefin polymers that have non-conjugated double bonds, coupled with these double bonds becoming cyclized or polymerized. Increased phenols added to drying oils or liquid diolefin polymers would lead to such side reactions and the resulting composition is difficult to dissolve in a polar solvent when making a varnish, or sparingly compatible with phenolic resins, or hardly permeable to paper or cloth.

Phenolic resins modified by a drying oil having conjugated double bonds such as tung oil are relatively free from the above drawbacks and capable of retaining adequate flexibility.

However, tung oil is a natural product and its price is very unstable. Moreover, the performance of tung oil modified phenolic resins has been insufficient for the modern electrical equipment and appliances which have been rapidly advancing. Therefore, new reactive plasticizers are demanded.

SUMMARY OF THE INVENTION

It is therefore an object of the present invention to provide a curable resin composition which can be readily processed into laminates useful in the manufacture of electronics equipment and appliances, such laminates having excellent electrical and physical properties including dielectric constant, chemical resistance, flexibility, dimensional stability and cold punching workability.

It is another object of the invention to provide a curable resin composition which permits the use of drying oils having non-conjugated double bonds without involving objectionable side reactions.

Briefly stated, the present invention provides a curable resin composition which essentially comprises:
(i) an amidated drying oil obtained by reacting a maleic anhydride adduct of a drying oil containing conjugated and/or non-conjugated double bonds and having an iodine value of greater than 100 with ammonia and/or a primary amine, and
(ii) a resol type phenolic resin resulting from the reaction between phenols and formaldehyde in the presence of an alkali catalyst.

According to another aspect of the invention, the resin composition further incorporates an amidated butadiene polymer derivative (iii) resulting from the reaction of a maleic anhydride adduct of a butadiene polymer having a number-average molecular weight of 300–10,000 with ammonia and/or a primary amine. This component (iii) has been found to improve the flexibility and chemicals resistance of the finished laminate product.

DETAILED DESCRIPTION OF THE PREFERRED EMBODIMENTS

The drying oil as used herein to constitute an important component of the intended resin composition refers to drying oils containing conjugated and/or non-conjugated double bonds and having an iodine value of greater than 100, and typically includes linseed oil, perilla oil, soybean oil, tung oil, dehydrated castor oil and the like which chiefly contains linolenic acid, linoleic acid, and eleostearic acid.

The maleic anhydride adduct referred to herein is available from the reaction of any of the above drying oils with maleic anhydride at 50°–300° C. in the well known manner.

Drying oils having conjugated double bonds can be added through the Diels-Alder reaction with maleic anhydride at a relatively low temperature of 50°–150° C. In the case of drying oils having non-conjugated double bonds, the reaction temperature is rather high at 150°–300° C. but can be reduced somewhat by adding small amounts of an organic peroxide, or by using air-blown drying oils. The addition reaction of maleic anhydride does not normally require the use of gel-inhibitors, but in the event of gel formation there may be used small amounts of phenylenediamines, pyrogallols or naphthols.

The amount of addition of maleic anhydride is 0.05–0.6 mol, preferably 0.1 to 0.5 mol per 100 grams of drying oil.

The maleic anhydride adduct of drying oil is reacted with ammonia and/or a primary amine to obtain the corresponding amide derivatives. The succinic anhydride group in the drying oil readily reacts with ammonia or primary amine under relatively mild conditions to provide a mono-amide derivative. When more than one equivalent of ammonia or amine is added to one equivalent of succinic anhydride group, the excess of ammonia or amine forms an ammonium or amine salt with a carboxylic acid. At a somewhat higher temperature, dehydration of the succinamic acid group may occur to form an imide derivative.

The reaction thus may become somewhat complicated depending upon the conditions employed. However, the reaction products according to the invention may contain some of the above by-products provided that the set of reaction conditions specified hereinafter are maintained.

It is possible to render an amide-containing drying oil soluble in the water by regulating the amount of ammonia or amine.

The ammonia used in the present invention may be added to the maleic anhydride adduct of drying oil in gaseous or aqueous phase.

The primary amine is a compound represented by the formula

R—NH<sub>2</sub> wherein R is an alkyl, aryl, alkaryl or aralkyl group having 1–20 carbon atoms.

The amount of ammonia or primary amine is preferably in the range of 0.2 to 3.0 mol per mol of succinic anhydride group.

The amidation reaction may be effected at 0°–150° C., usually proceeds very fast and may be completed within one or two hours. Excessively high reaction temperatures would lead to dehydration to form imide rings.

Now, the reaction according to the invention may take place in the presence or absence of a solvent. This solvent when desired to be used should preferably be such hydrocarbons or ethers which are not reactive with ammonia, amine or carboxylic acid. Alcohols however may also be used. They react with succinic anhydride group to produce a drying oil having both amide and ester groups.

The other constituent of the resin composition according to the invention is, as already stated, a phenol-formaldehyde resin resulting from the condensation of phenols and aldehydes in the presence of a basic catalyst. The phenols referred to herein may be phenol, cresol, xylenol, resorcin and bisphenol.

These phenolic compounds may be used alone or in combination. The aldehydes may include formaldehyde and formaldehyde-producing compounds such as paraformaldehyde.

The basic catalyst used for condensation of phenols may preferably include alkali metal hydroxides, alkaline-earth metal hydroxides, ammonia and amines.

The amidated drying oils and the phenol-formaldehyde resin may be separately synthesized and mixed for curing, or a phenolic compound and formaldehyde may be subjected to condensation reaction in the presence of the amidated drying oil.

The amidated drying oil and the phenol-formaldehyde resin may be blended in widely varying ratios depending upon the properties of the ultimate cured product that may be desired. The ratio of the two materials may however preferably be in the range of from 5:95 to 80:20, more preferably from 20:80 to 60:40.

The curable resin composition comprising the amidated drying oil (i) and the phenol-formaldehyde resin (ii) may be cured at 100°–250° C. without the use of any catalyst. The resin composition may be processed into an laminated article for use for example as a printed circuit board or a chassis board mounting various electrical component parts. To obtain such laminates, the resin composition per se or its components (i) and (ii) separately is dissolved in a suitable solvent which may be alcohols such as methanol, ethanol and butanol; ketones such as acetone and methyl ethyl ketone; and aromatic hydrocarbons such as benzene, toluene and xylene. The resulting varnish is impregnated into a fibrous substrate such as of paper, cloth, synthetic fabric, asbestos and glass fiber. The impregnated substrate is then dried to obtain pregregs containing 30–70 percent by weight, preferably 35–55 percent by weight of dry resin.

The prepregs are laminated in as many plies as desired and cured usually at a pressure of 20–200 kg/cm², at a temperature of 130°–180° C. and for 20–180 minutes.

It has now been found that the resin composition can be further improved particularly in its flexibility and chemical resistance by incorporating an additional component which is, as described at the outset, an amidated butadiene polymer (iii).

This butadiene polymer may be obtained by reacting a butadiene homopolymer having a number-average molecular weight of 300–10,000 or a butadiene copolymer containing at least 50% of the butadiene units with maleic anhydride and then reacting the thus maleinized polymer or copolymer with ammonia and/or a primary amine.

The starting butadiene polymers used in this invention preferably include butadiene homopolymers prepared by the polymerization of butadiene alone, copolymers prepared by the copolymerization of butadiene and a vinyl monomer such as styrene, and copolymers prepared by the copolymerization of butadiene and a diolefin such as isoprene, these polymerization and copolymerization being carried out in a hydrocarbon solvent in the presence of an alkali metal such as lithium and sodium or their organometal compounds. Also included are butadiene homopolymers and copolymers prepared by the polymerization or copolymerization of butadiene using an alkali metal such as sodium as a catalyst and using a polycyclic aromatic compound such as anthracene as an activating agent in a polar solvent such as tetrahydrofuran. Other butadiene materials include butadiene homopolymers and copolymers prepared using a coordination anionic polymerization catalyst, and those prepared by the telomerization of butadiene in the presence of a radical initiator.

The number-average molecular weight of the butadiene polymers (iii) is in the range of 300–10,000, preferably 500–5,000. Smaller number-average molecular weight would result in a decline in respect of flexibility, strength, heat resistance and chemicals resistance. On the other hand, greater number-average molecular weight of butadiene polymers would result in too viscous resin composition which is difficult to handle.

The butadiene polymers under contemplation are not limited in their microstructure, and those rich in 1,2-bonds or 1,4-bonds may likewise be used.

The maleinized butadiene polymers, copolymers and mixtures thereof according to the invention may be prepared by reacting the starting butadiene polymer with maleic anhydride at 100°–300° C. in the well known manner. When necessary, gel formation may be inhibited by adding to the reaction mixture an inhibitor such as phenylenediamines, pyrogallols or naphthols. The amount of maleic anhydride added in the maleinized reaction is in the range of 0.05–0.6 mol, preferably 0.1–0.5 mol per 100 grams of the butadiene polymer.

The maleic anhydride adduct of butadiene polymer is then reacted with ammonia and/or a primary amine to obtain the corresponding amide derivative.

Any amidated butadiene polymers if they partially contain carboxylic acid salts or succinamide groups, can be used with success, provided that such polymers are obtained under the reaction conditions that are hereinafter specified.

The amidation reaction usually proceeds sufficiently rapidly and may be effected at 0° to 120° C., preferably, at ambient to 50° C. Higher reaction temperature would involve dehydration whereby succinic acid groups are converted entirely to succinimide groups. The reaction may be effected in the presence or absence of a solvent. The solvent when desired to be used may preferably be such hydrocarbons or ethers which are not reactive with ammonia, amines, or carboxylic acid. Certain reactive solvents such as alcohols may also be used in which part of the succinic anhydride groups is esterified to synthesize a polymer having both amide and ester groups.

Gaseous ammonia or concentrated aqueous ammonia may be added to the maleinized butadiene polymer or a solution thereof. The primary amine used in this invention is a compound represented by the following formula $R-NH_2$ wherein R is an alkyl, aryl, alkaryl or aralkyl group having 1–20 carbon atoms. The amount of ammonia or primary amine is used preferably in the range of 0.2–3.0 mol per mol of succinic anhydride group. The amidated butadiene polymer may be rendered water-soluble by regulating the amount of ammonia or primary amine, or may be blended directly with a water soluble phenolic resin.

Since the amidated drying oils (i) and the butadiene polymer derivatives (iii) are obtainable under similar reaction conditions, the starting drying oil and the starting butadiene polymer may be conveniently blended first and then reacted with maleic anhydride and further with ammonia and/or amine.

The invention will be further described by way of the following examples.

Synthesis 1

A maleinized linseed oil having an acid value of 143 mgKOH/g was prepared by reacting 1,000 grams linseed oil with 333 grams maleic anhydride at 195° C. for 3 hours.

1,000 grams maleinized linseed oil and 800 grams toluene were taken into a 3 liter separable flask equipped with reflux condenser and heated at 50° C., followed by addition with stirring of droplets of 130 grams of 25% aqueous ammonia over a period of about 30 minutes. Stirring was continued for 1 hour at 50° C. Then all volatiles are removed in vacuum at 80° C. 1,088 grams methanol was added to make a methanol solution containing 50 percent by weight of resin.

Synthesis 2

A maleinized tung oil having an acid value of 144 mgKOH/g was prepared by reacting 1,000 grams tung oil with 337 grams maleic anhydride at 110° C. for 3 hours.

1,000 grams maleinized tung oil and 800 grams toluene were taken into a 3 liter separable flask equipped with reflux condenser and heated at 50° C., followed by addition with stirring of droplets of 130 grams of 25% aqueous ammonia over a period of about 30 minutes. Stirring was continued for 1 hour at 50° C., until the temperature was increased to 80° C. so as to remove all volatiles in vacuum. 1,088 grams methanol was added to make a methanol solution containing 50 percent by weight of resin.

Synthesis 3

1,000 grams maleinized linseed oil obtained in Synthesis 1 above and 619 grams toluene were charged into a 3 liter separable flask equipped with reflux condenser and heated at 50° C., followed by addition with stirring of droplets of 238 grams aniline over about 30 minutes. Stirring was continued for another hour at 50° C. 619 grams methanol was then added to make a toluene-methanol (1:1 by wt. %) solution containing 50 percent by weight of resin.

Synthesis 4

485 grams of 37% formaldehyde, 470 grams of phenol and 34 grams of 25% aqueous ammonia were reacted at 90° C. for 30 minutes. The resulting admixture was dehydrated in vacuum, followed by addition of methanol to make a varnish containing 50 percent by weight of resin.

Synthesis 5

A butadiene polymer obtained by polymerizing butadiene in the presence of a sodium catalyst and having a number-average molecular weight of 800 and 56% vinylbonds was reacted with maleic anhydride at 195° C. for 5 hours to produce a maleinized butadiene polymer having an acid value of 160 mgKOH/g.

1,000 grams maleinized butadiene polymer and 800 grams toluene were taken into a 3 liter separable flask equipped with reflux condenser and heated at 50° C., followed by addition with stirring of droplets of 146 grams of 25% aqueous ammonia over a period of about 30 minutes. Stirring was continued for 1 hour at 50° C., until the temperature was increased to 80° C. so as to remove all volatiles in vacuum. 1,049 grams methanol was added to make a methanol solution containing 50 percent by weight of resin.

Inventive Examples 1–8

The various varnishes prepared in the above Synthesis 1–5 were blended as shown in Table 1. Each blend was impregnated into a cotton linter paper and dried. The resulting impregnated paper carried 45 percent by weight of resin. 9 sheets of this paper were superposed and pressed together at 160° C. and at 100 kg/cm² for 80 minutes thereby producing a 1.6 mm thick laminate.

Comparative Example 1

500 grams tung oil, 756 grams meta-cresol and 2 grams paratoluene sulfonic acid were reacted at 100° C. for 2 hours. The admixture was added with 738 grams of 37% formalin and 48 grams of 25% aqueous ammonia and then, the reaction was continued at 90° C. for 3 hours. The reaction product was dehydrated in vacuum, followed by addition of a methanol-toluene (1:1 by wt. %) mixture to make a varnish containing 50 percent by weight of resin. The varnish was impregnated into a cotton linter paper and dried. The resulting impregnated paper carrying 45 percent by weight of resin was processed into a laminate in the manner described in connection with Inventive Examples 1–8.

Comparative Example 2

500 grams linseed oil, 756 grams meta-cresol and 3 grams paratoluene solfonic acid were reacted at 120° C. for 2 hours. The admixture was added with 738 grams of 37% formalin and 48 grams of 25% aqueous ammonia and then, the reaction was continued at 90° C. for 3 hours. The reaction product was dehydrated in vacuum, followed by addition of a methanol-toluene (1:1 by wt. %) mixture to make a varnish containing 50 percent by weight of resin. The varnish was impregnated into a cotton linter paper and dried. The resulting impregnated paper carrying 45 percent by weight of resin was processed into a laminate in the manner described in connection with Inventive Examples 1-8.

Table 1 shows the test data of the various varnishes obtained as above, from which it is obvious that the inventive composition comprising an amidated drying oil and a resol type phenolic resin excels the conventional tung oil or linseed oil modified phenolic resin in respect of the electrical properties, solvent resistance, heat resistance and cold punching workability.

adding maleic anhydride to said drying oil in an amount of 0.05–0.6 mol of maleic anhydride per 100 grams of said drying oil.

4. A curable resin composition as claimed in claim 1 wherein said phenols include phenol, cresol, xylenol, resorcin and bisphenol.

5. A curable resin composition as claimed in claim 1 wherein said catalyst is selected from the group consisting of alkali metal hydroxides, alkaline-earth metal hydroxides, ammonia and amines.

6. A curable resin composition as claimed in claim 1

TABLE 1

| | | Inventive Example 1 | Inventive Example 2 | Inventive Example 3 | Inventive Example 4 | Inventive Example 5 |
|---|---|---|---|---|---|---|
| Varnish Blends | Varnish of Synthesis 1 | 50 wt. parts | 30 wt. parts | — | — | — |
| | Varnish of Synthesis 2 | — | — | 50 wt. parts | 30 wt. parts | — |
| | Varnish of Synthesis 3 | — | — | — | — | 50 wt. parts |
| | Varnish of Synthesis 4 | 50 wt. parts | 70 wt. parts | 50 wt. parts | 70 wt. parts | 50 wt. parts |
| | Varnish of Synthesis 5 | — | — | — | — | — |
| Insulation Resistance ($\Omega$) | Normal | $1.5 \times 10^{12}$ | $5.5 \times 10^{12}$ | $3.3 \times 10^{12}$ | $6.3 \times 10^{12}$ | $1.8 \times 10^{12}$ |
| | After boil | $1.1 \times 10^{11}$ | $6.5 \times 10^{11}$ | $3.0 \times 10^{11}$ | $2.4 \times 10^{11}$ | $9.5 \times 10^{11}$ |
| Solder Heat Resistance (sec.) | | 45 | 52 | 45 | 49 | 41 |
| Solvent Resistance (boiled trichlene) | | satisfactory for 10 mins. | satisfactory for 15 mins. | satisfactory for 10 mins. | satisfactory for 10 mins. | satisfactory for 10 mins. |
| Punch Workability (marks at ambient temperature) | | 90 | 85 | 90 | 90 | 90 |
| | | Inventive Example 6 | Inventive Example 7 | Inventive Example 8 | Comparative Example 1 | Comparative Example 2 |
| Varnish Blends | Varnish of Synthesis 1 | — | — | 25 wt. parts | — | — |
| | Varnish of Synthesis 2 | 20 wt. parts | — | — | — | — |
| | Varnish of Synthesis 3 | — | 25 wt. parts | — | — | — |
| | Varnish of Synthesis 4 | 50 wt. parts | 50 wt. parts | 50 wt. parts | — | — |
| | Varnish of Synthesis 5 | 30 wt. parts | 25 wt. parts | 25 wt. parts | — | — |
| Insulation Resistance ($\Omega$) | Normal | $4.0 \times 10^{12}$ | $2.0 \times 10^{12}$ | $6.6 \times 10^{12}$ | $2.0 \times 10^{12}$ | $3.7 \times 10^{12}$ |
| | After boil | $3.6 \times 10^{11}$ | $9.5 \times 10^{10}$ | $4.7 \times 10^{11}$ | $8.6 \times 10^{10}$ | $8.7 \times 10^{10}$ |
| Solder Heat Resistance (sec.) | | 45 | 42 | 43 | 37 | 15 |
| Solvent Resistance (boiled trichlene) | | satisfactory for 10 mins. | satisfactory for 10 mins. | satisfactory for 15 mins. | satisfactory for 10 mins. | unsatisfactory after 2 mins. |
| Punch Workability (marks at ambient temperature) | | 90 | 90 | 80 | 80 | 70 |

What is claimed is:

1. A curable resin composition essentially comprising:
   (i) an amidated drying oil obtained by reacting a maleic anhydride adduct of a drying oil containing conjugated and/or non-conjugated double bonds and having an iodine value of greater than 100 with ammonia and/or a primary amine to produce an amide of said maleic anhydride adduct, and
   (ii) a resol type phenolic resin resulting from the reaction between phenols and formaldehyde in the presence of an alkali catalyst.

2. A curable resin composition as claimed in claim 1 wherein said drying oil is selected from the group consisting of linseed oil, perilla oil, soybean oil, tung oil and dehydrated castor oil.

3. A curable resin composition as claimed in claim 1 wherein said maleic anhydride adduct is obtained by wherein the ratio of the component (i) to the component (ii) is in the range of from 5:95 to 80:20.

7. A curable resin composition comprising:
   (i) an amidated drying oil obtained by reacting a maleic anhydride adduct of a drying oil containing conjugated and/or non-conjugated double bonds and having an iodine value of greater than 100 with ammonia and/or a primary amine to produce an amide of said maleic anhydride adduct,
   (ii) a resol type phenolic resin resulting from the reaction between phenols and formaldehyde in the presence of an alkali catalyst, and
   (iii) an amidated butadiene polymer resulting from the reaction of a maleic anhydride adduct of a butadiene polymer having a number-average molecular weight of 300–10,000 with ammonia and/or a primary amine.

8. A curable resin composition as claimed in claim 1 or 7 in which said maleic anhydride adduct is reacted with ammonia.

9. A curable resin composition as claimed in claim 1 or 7 in which said maleic anhydride adduct is reacted with a primary amine.

10. A curable resin composition as claimed in claim 1 or 7 in which said maleic anhydride adduct is reacted with ammonia and a primary amine.

11. A curable resin composition as claimed in claim 1 or 7 in which said amidated drying oil is obtained by reacting said maleic anhydride adduct of said drying oil with about 0.2 to 3.0 mols of said ammonia and/or primary amine per mol of anhydride group.

12. A curable resin composition as claimed in claim 1 wherein the ratio of component (i) to component (ii) is about 20:80 to 60:40.

13. A curable resin composition as claimed in claim 7 in which said amidated butadiene polymer is obtained by reaction of said maleic anhydride adduct of said butadiene polymer and about 0.2 to 3.0 mols of said ammonia and/or primary amine per mol of anhydride.

14. A cured resin composition obtaining by curing the curable composition defined in claim 1 or 7.

* * * * *